(12) United States Patent
Ohnishi

(10) Patent No.: US 10,533,098 B2
(45) Date of Patent: Jan. 14, 2020

(54) CONDUCTIVE FILLER, METHOD FOR PRODUCING SAME, CONDUCTIVE PASTE AND METHOD FOR PRODUCING CONDUCTIVE PASTE

(71) Applicant: SEKISUI CHEMICAL CO., LTD., Osaka, Osaka (JP)

(72) Inventor: Shigekatsu Ohnishi, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 215 days.

(21) Appl. No.: 14/907,736

(22) PCT Filed: Jul. 29, 2014

(86) PCT No.: PCT/JP2014/069901
§ 371 (c)(1),
(2) Date: Jan. 26, 2016

(87) PCT Pub. No.: WO2015/016202
PCT Pub. Date: Feb. 5, 2015

(65) Prior Publication Data
US 2016/0168395 A1 Jun. 16, 2016

(30) Foreign Application Priority Data

Aug. 1, 2013 (JP) .................... 2013-160480
Dec. 26, 2013 (JP) .................... 2013-269465

(51) Int. Cl.
*H01B 1/22* (2006.01)
*C09D 5/24* (2006.01)
*C23C 16/06* (2006.01)

(52) U.S. Cl.
CPC ............... *C09D 5/24* (2013.01); *C23C 16/06* (2013.01)

(58) Field of Classification Search
CPC ........ C09D 5/24; B22F 1/0055; B22F 1/0059; B22F 1/02; C22C 1/0425; C22C 9/00; C22C 9/06; C23C 16/06; H01B 1/22
(Continued)

(56) References Cited

U.S. PATENT DOCUMENTS 7,351,372 B2 * 4/2008 Inohana .................... C22C 9/02
148/433
7,399,532 B2 * 7/2008 Seido ..................... B32B 15/01
428/457

(Continued)

FOREIGN PATENT DOCUMENTS

CN 1517446 A 8/2004
CN 1883013 A 12/2006
(Continued)

OTHER PUBLICATIONS

Hashimoto et al. "Nano-structured two-phase heat spreader for cooling ultra-high heat flux sources". Proceedings of the 14th International Heat Transfer Conference. Aug. 8-13, 2010. Total pp. 11.*

(Continued)

*Primary Examiner* — Mark Kopec
*Assistant Examiner* — Jaison P Thomas
(74) *Attorney, Agent, or Firm* — Cheng Law Group, PLLC

(57) ABSTRACT

A conductive paste having excellent electroconductivity and thermal conductivity is provided. A conductive paste comprising a conductive filler comprising a copper alloy powder comprising at least one transition metal belonging to group 8 to group 10 of the periodic table, and a carbon allotrope covering a surface of the copper alloy powder; and a binder resin.

19 Claims, 7 Drawing Sheets

(58) Field of Classification Search
USPC .................................................. 252/503, 500
See application file for complete search history.

(56) References Cited

U.S. PATENT DOCUMENTS

| | | | |
|---|---|---|---|
| 2004/0140022 A1 | 7/2004 | Inohana et al. | |
| 2006/0065543 A1* | 3/2006 | Arai | B22F 1/00 205/577 |
| 2007/0018142 A1 | 1/2007 | Kwon et al. | |
| 2007/0190348 A1* | 8/2007 | Ichiki | B22F 1/02 428/567 |
| 2010/0092868 A1 | 4/2010 | Kim et al. | |
| 2010/0224025 A1 | 9/2010 | Ono et al. | |
| 2010/0261028 A1* | 10/2010 | Kondoh | B22F 1/02 428/539.5 |
| 2011/0256014 A1 | 10/2011 | Hong et al. | |
| 2012/0100303 A1* | 4/2012 | Kim | B82Y 30/00 427/553 |
| 2013/0045385 A1 | 2/2013 | Kim et al. | |
| 2016/0367971 A1* | 12/2016 | Zhuo | B01J 37/0225 |

FOREIGN PATENT DOCUMENTS

| | | | |
|---|---|---|---|
| CN | 1979929 A | 6/2007 | |
| CN | 100577832 C | 1/2010 | |
| EP | 3 115 130 A1 | 1/2017 | |
| EP | 3115130 A1 * | 1/2017 | ............... B22F 1/02 |
| JP | 7-331125 A | 12/1995 | |
| JP | 7-331360 A | 12/1995 | |
| JP | 2002-8444 A | 1/2002 | |
| JP | 2004-169081 A | 6/2004 | |
| JP | 2008-74647 A | 4/2008 | |
| JP | 2008-285697 A | 11/2008 | |
| JP | 2009-30090 A | 2/2009 | |
| JP | 2010-53440 A | 3/2010 | |
| JP | 2011-225993 A | 11/2011 | |
| JP | 2013-40403 A | 2/2013 | |
| JP | 2013-513730 A | 4/2013 | |
| JP | 2013-91816 A | 5/2013 | |
| JP | 2013-91824 A | 5/2013 | |
| WO | WO-2009/054309 A1 | 4/2009 | |
| WO | WO-2011/073514 A1 | 6/2011 | |

OTHER PUBLICATIONS

The First Office Action for the Application No. 201480043505.4 from The State Intellectual Property Office of the People's Republic of China dated Nov. 7, 2016.
Supplementary European Search Report for the Application No. EP 14 83 2327 dated Feb. 17, 2017.
Li, Y. et al., "Isotropically Conductive Adhesives (ICAs)", Electrical Conductive Adhesives with Nanotechnologies, 2009, pp. 121-128.
Jourdain, Vincent et al., "Current understanding of the growth of carbon nanotubes in catalytic chemical vapour deposition." Carbon, Elsevier, 2013, vol. 58, pp. 2-39.
Hashimoto, Mitsuo et al., "Nano-Structured Two-Phase Heat Spreader for Cooling Ultra-High Heat Flux Sources", Proceedings of the 14th International Heat Transfer Conferences, 2010, vol. 3, pp. 1-11.
International Search Report for the Application No. PCT/JP2014/069901 dated Sep. 2, 2014.
Written Opinion of the International Searching Authority (PCT/ISA/237) for Application No. PCT/JP2014/069901 dated Sep. 2, 2014.
Written Opinion of the International Searching Authority (PCT/ISA/237) for Application No. PCT/JP2014/069901 dated Sep. 2, 2014 (English Translation mailed Feb. 11, 2016).
The Third Office Action for the Application No. 201480043505.4 from The State Intellectual Property Office of the People's Republic of China dated Jan. 2, 2018.
European Office Action for Application No. EP 14 832 327.2 dated Apr. 9, 2018.
European Office Action for Application No. EP 14 832 327.2 dated Nov. 26, 2018.
European Office Action for Application No. 14 832 327.2 dated Sep. 25, 2019.

* cited by examiner

[FIG. 1]
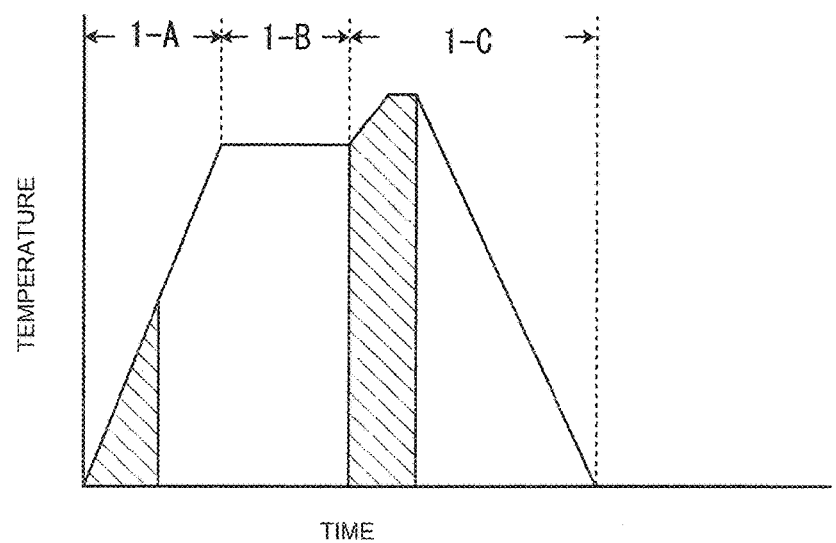
[FIG. 2]
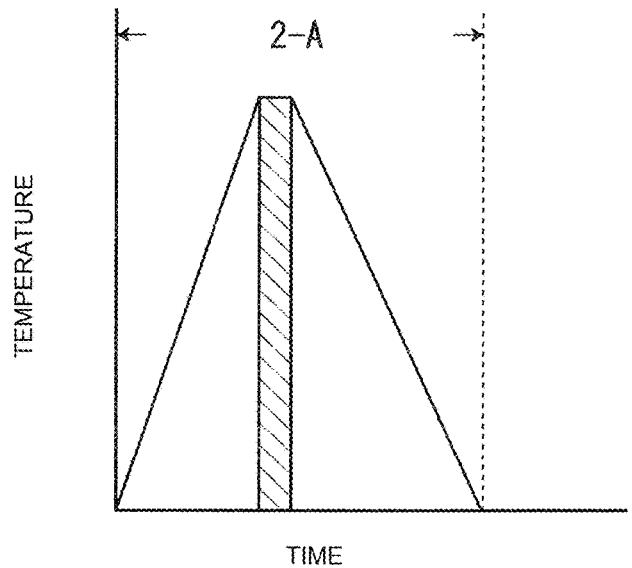

[FIG. 3]
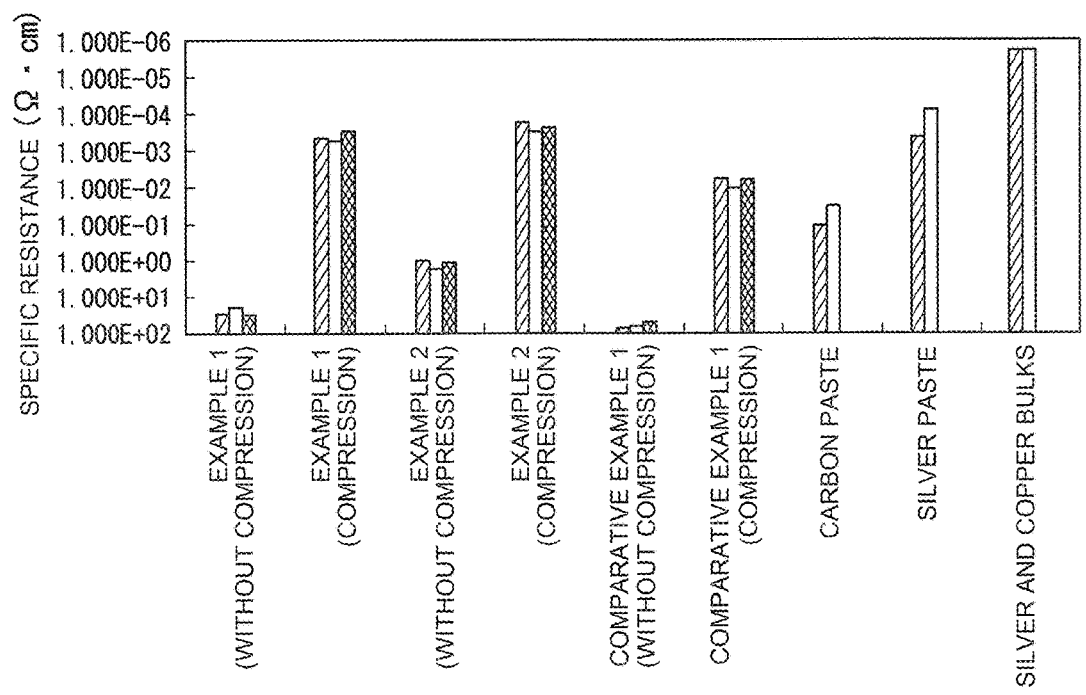
[FIG. 4]

[FIG. 5]
[FIG. 6]
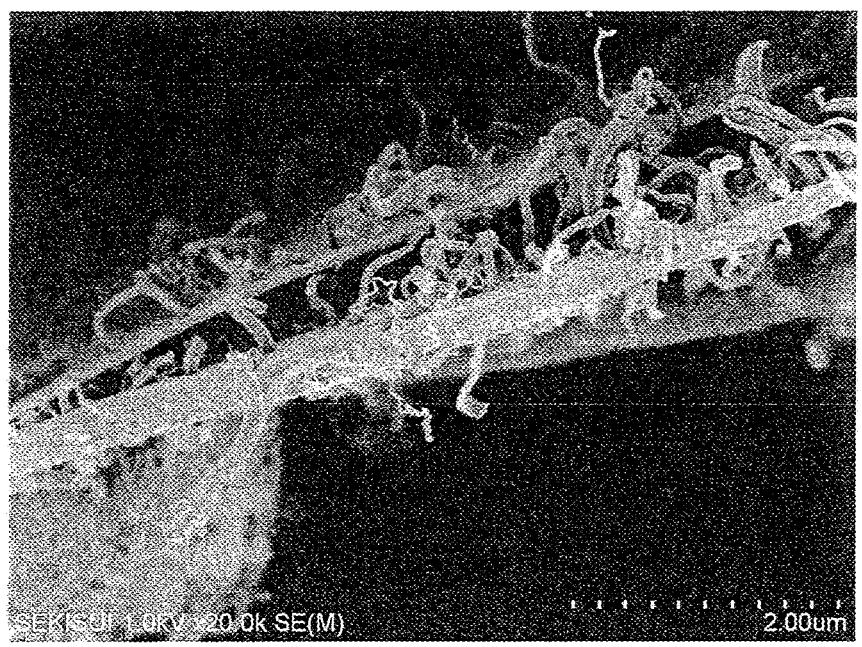

[FIG. 7]
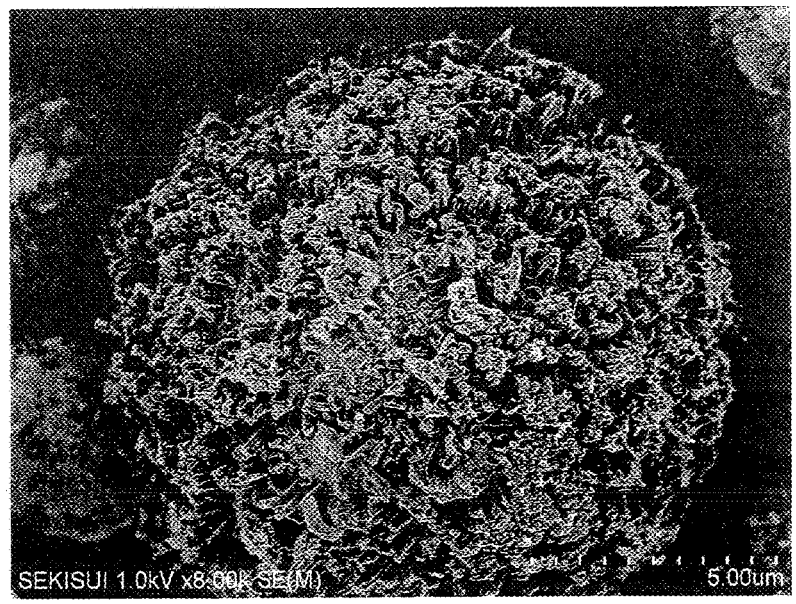
[FIG. 8]
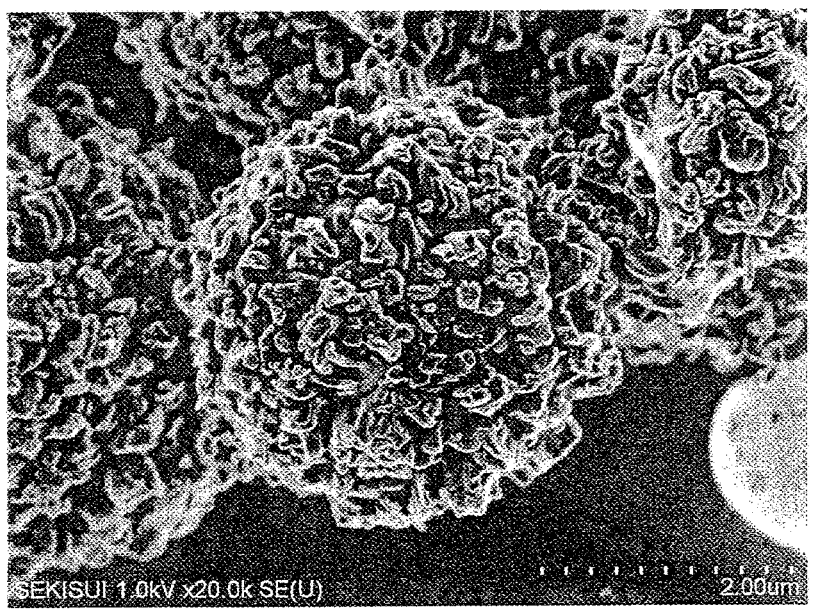

[FIG. 9]
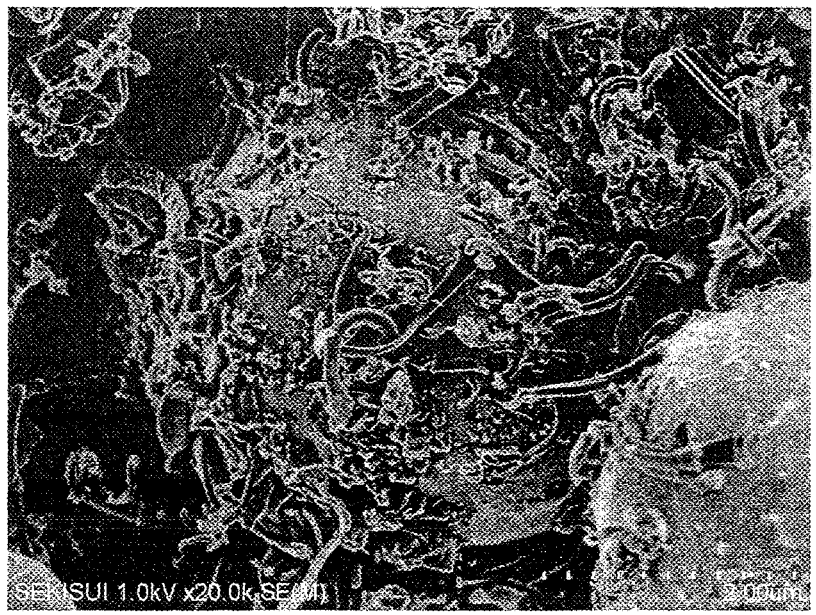
[FIG. 10]
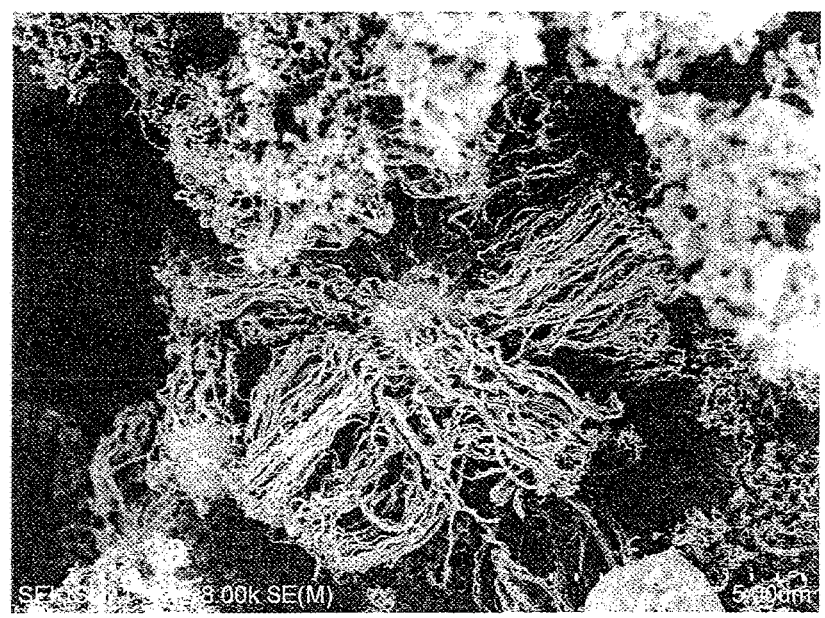

[FIG. 11]
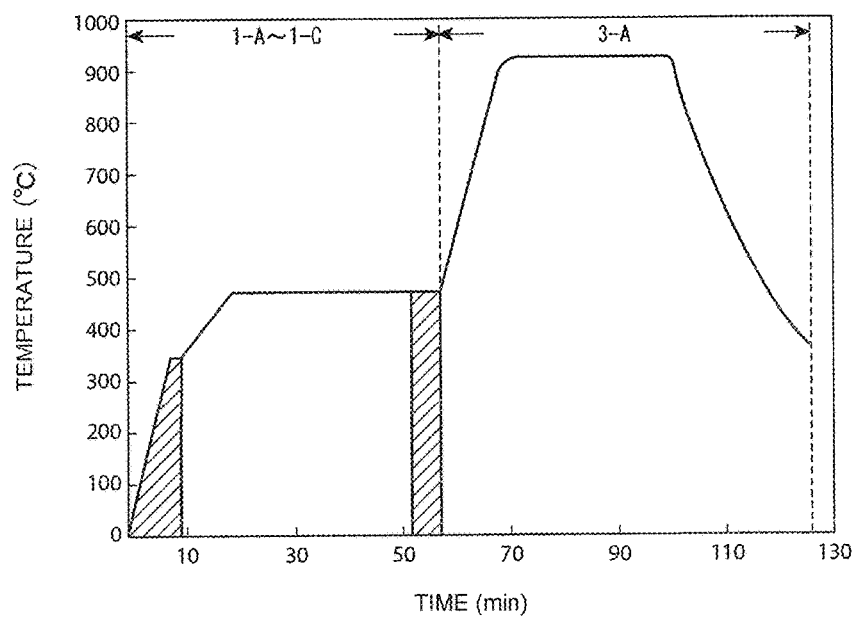
[FIG. 12]
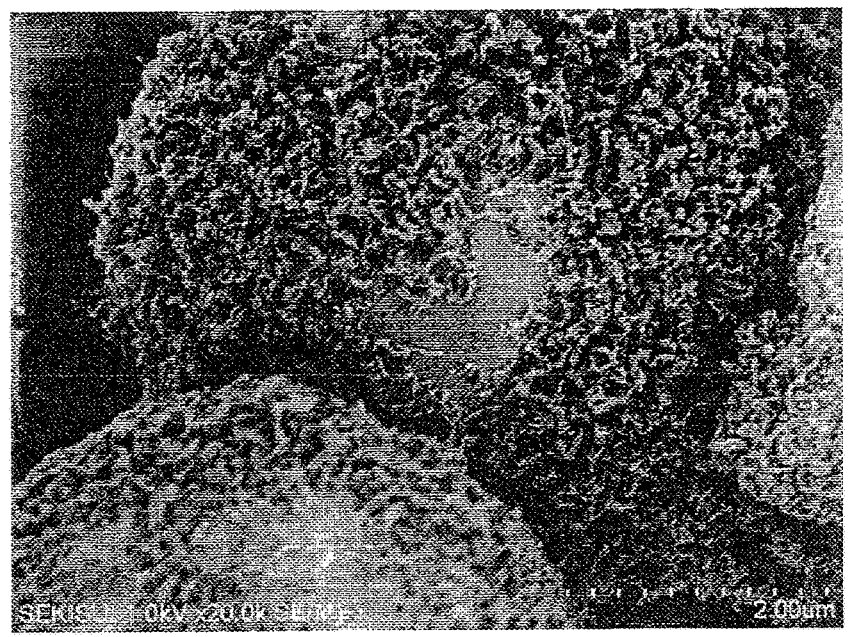

[FIG. 13]
[FIG. 14]
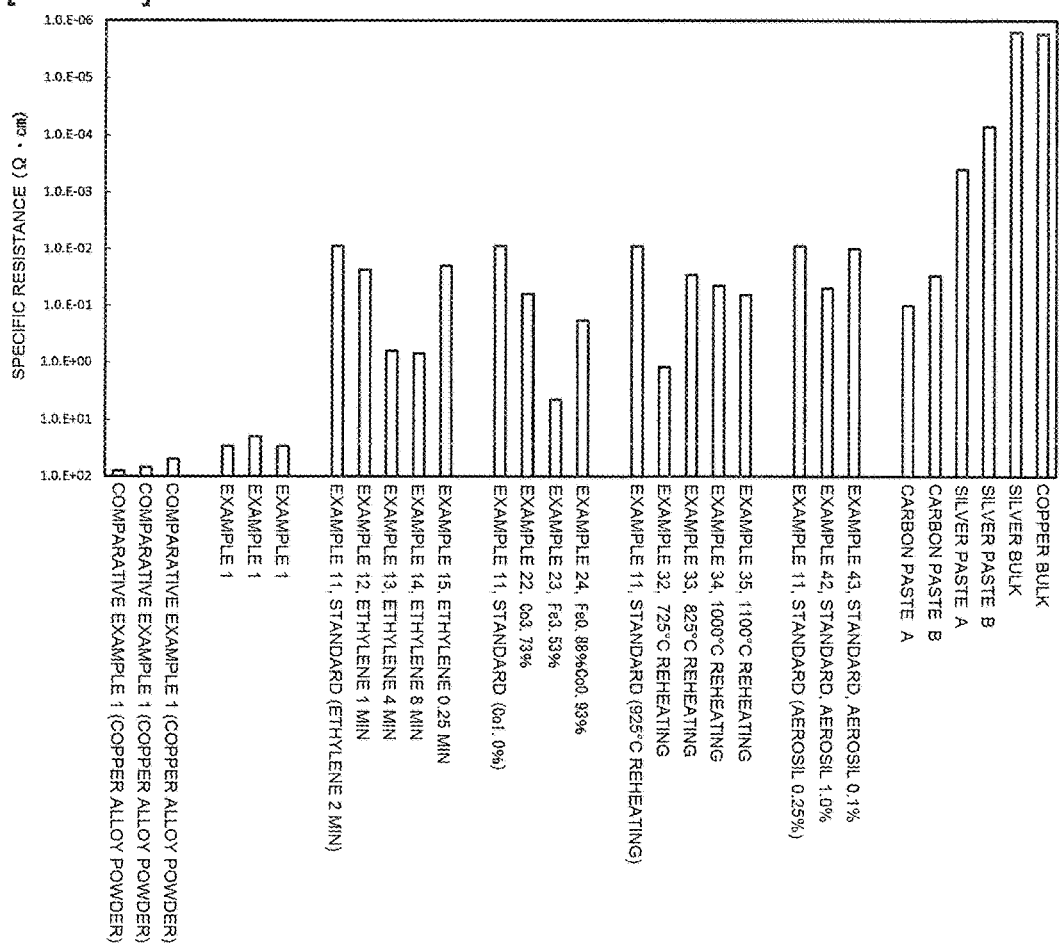

CONDUCTIVE FILLER, METHOD FOR PRODUCING SAME, CONDUCTIVE PASTE AND METHOD FOR PRODUCING CONDUCTIVE PASTE

TECHNICAL FIELD

The present invention relates to a conductive paste such as an electrically conductive (electroconductive) paste or a thermally conductive paste and a method for producing the same. In addition, the present invention relates to a conductive filler for forming the above conductive paste, and a method for producing the same.

BACKGROUND ART

Various conductive pastes comprising copper powders and binder resins are known. Examples of such conductive pastes include electroconductive pastes used as circuits and electroconductive adhesives, and thermally conductive pastes.

But, copper oxidizes easily, and when an electroconductive paste in which a copper powder is used as a filler is applied, and heated and cured in the air, an oxide film of copper is easily produced by reaction with oxygen. A problem is that because of the influence of the oxide film, the electrical resistance increases.

On the other hand, conventionally, a variety of composite materials obtained by mixing, in addition to a metal powder such as a copper powder and a binder resin, carbon fibers exhibiting high electroconductivity are also proposed.

However, in the materials comprising carbon fibers, the carbon fibers tend to aggregate when the carbon fibers are dispersed and in coating.

The following Patent Literature 1 discloses a method of placing a metal catalyst on a metal surface and producing carbon nanotubes with the metal catalyst. The carbon nanotubes are connected to the metal surface, and therefore the aggregation of the carbon nanotubes is less likely to occur.

CITATION LIST

Patent Literature

Patent Literature 1: Japanese Patent Laid-Open No. 2008-74647

SUMMARY OF INVENTION

Technical Problem

The method described in Patent Literature 1 only produces carbon nanotubes on a metal substrate. In other words, conventionally, it is difficult to uniformly disperse a carbon material such as carbon nanotubes or carbon fibers in a composition comprising a metal powder and a binder resin, such as an electroconductive paste or a thermally conductive paste. Therefore, it is difficult to exhibit high electroconductivity or high thermal conductivity.

It is an object of the present invention to provide a conductive paste in which electroconductivity or thermal conductivity can be effectively increased and a method for producing the same. In addition, it is an object of the present invention to provide a conductive filler for forming the above conductive paste, and a method for producing the same.

Solution to Problem

A conductive filler according to the present invention is composite particles comprising a copper alloy powder comprising at least one transition metal belonging to group 8 to group 10 of the periodic table, and a carbon allotrope covering a surface of the copper alloy powder. The above carbon allotrope may grow from the transition metal belonging to group 8 to group 10 of the periodic table in the above copper alloy powder.

In the conductive filler according to the present invention, preferably, the above copper alloy powder is flaky. In this case, the above composite particles are composite flake particles in which the carbon allotrope covers the surface of the copper alloy powder.

In the conductive filler according to the present invention, preferably, a content of the transition metal in the above copper alloy powder is 0.3 to 6.0% by weight based on 100% by weight of the above copper alloy powder.

In the conductive filler according to the present invention, preferably, as the above transition metal, iron or cobalt is used. More preferably, cobalt is used.

In the conductive filler according to the present invention, preferably, the above carbon allotrope adheres to the surface of the copper alloy powder in a range of greater than 0% by weight and 3% by weight or less based on 100% by weight of the copper alloy powder.

In the conductive filler according to the present invention, the carbon allotrope is preferably a carbon nanofiber, and in this case, it is desired that one end of the carbon nanofiber is bonded to the above copper alloy powder.

A conductive paste according to the present invention comprises the conductive filler according to the present invention and a binder resin.

In the conductive paste according to the present invention, as the above binder resin, preferably at least one resin selected from a group consisting of an epoxy resin, a polyester resin, a urethane resin, a phenolic resin, and an imide resin is used.

More preferably, it is desired that 10 to 35 parts by mass of the above binder resin are contained based on 100 parts by mass of the above conductive filler.

The conductive paste of the present invention may be an electrically conductive paste, that is, an electroconductive paste, or a thermally conductive paste.

A method for producing a conductive filler according to the present invention comprises steps of providing a copper alloy powder comprising at least one transition metal belonging to group 8 to group 10 of the periodic table; and contacting a carbon source with a surface of the copper alloy powder to obtain a conductive filler.

In a particular aspect of the method for producing a conductive filler according to the present invention, the step of providing a copper alloy powder is performed by an atomization method.

In another particular aspect of the method for producing a conductive filler according to the present invention, the step of contacting a carbon source with a surface of the above copper alloy powder to obtain a conductive filler is a step of performing treatments in order of CVD treatment, flaking treatment, and re-CVD treatment to obtain a conductive filler. Carbon fibers are produced at 400° C. to 750° C.

In another particular aspect of the method for producing a conductive filler according to the present invention, the step of contacting a carbon source with a surface of the above copper alloy powder to obtain a conductive filler is a step of performing treatments in order of CVD treatment and heat treatment to obtain a conductive filler.

In still another particular aspect of the method for producing a conductive filler according to the present invention, the above heat treatment is performed under an inert gas atmosphere under a temperature atmosphere of 750° C. to 1000° C.

In still another particular aspect of the method for producing a conductive filler according to the present invention, the step of contacting a carbon source with a surface of the above copper alloy powder to obtain a conductive filler is a step of contacting the copper alloy powder with a carbon-containing gas at 300° C. to 400° C.

In still another particular aspect of the method for producing a conductive filler according to the present invention, the method further comprises a step of adding and mixing a sintering inhibitor before the step of contacting a carbon source with a surface of the copper alloy powder to obtain a conductive filler.

A method for producing a conductive paste according to the present invention comprises steps of producing a conductive filler according to the method for producing a conductive filler according to the present invention; and mixing the above conductive filler and a binder resin and then kneading an obtained mixture to obtain a conductive paste.

Advantageous Effects of Invention

In the conductive filler and the conductive paste according to the present invention, the surface of the copper alloy powder is covered with the carbon allotrope, and therefore a conductive filler and a conductive paste exhibiting high electroconductivity and high thermal conductivity can be provided.

BRIEF DESCRIPTION OF DRAWINGS

FIG. 1 is a diagram showing a heat profile as one example of a method for producing composite particles.

FIG. 2 is a diagram showing the heat profile of re-CVD treatment.

FIG. 3 is a diagram showing the specific resistance of electroconductive pastes provided in Examples and pastes comprising a variety of materials.

FIG. 4 is a diagram showing an electron micrograph of composite particles provided in Example 1 at 8000× magnification.

FIG. 5 is a diagram showing an electron micrograph of composite particles provided in Example 2 at 4000× magnification.

FIG. 6 is a diagram showing an electron micrograph of the composite particles provided in Example 2 at 20000× magnification.

FIG. 7 is a diagram showing an electron micrograph of composite particles provided in Example 3 at 8000× magnification.

FIG. 8 is a diagram showing an electron micrograph of composite particles provided in Example 4 at 20000× magnification.

FIG. 9 is a diagram showing an electron micrograph of composite particles provided in Example 5 at 20000× magnification.

FIG. 10 is a diagram showing an electron micrograph of composite particles provided in Example 6 at 8000× magnification.

FIG. 11 is a diagram showing a heat profile when a heat treatment step is provided after a CVD step.

FIG. 12 is a diagram showing an electron micrograph of composite particles provided in Example 11 at 20000× magnification.

FIG. 13 is a diagram showing an electron micrograph of the composite particles provided in Example 11 at 2000× magnification.

FIG. 14 is a diagram showing the specific resistance of electroconductive pastes provided in Examples and pastes comprising a variety of materials under conditions without compression.

DESCRIPTION OF EMBODIMENTS

The details of the present invention will be described below.

1. Conductive Filler 1-1. Copper Alloy Powder

A conductive filler according to the present invention is a filling material comprising composite particles comprising a copper alloy powder comprising at least one transition metal belonging to group 8 to group 10 of the periodic table, and a carbon allotrope covering the surface of the copper alloy powder. The composite particles may be composite flake particles in which the above copper alloy powder that is flaky is covered with the carbon allotrope. A conductive paste according to the present invention comprises the above conductive filler and a binder resin.

As used herein, the phrase "the carbon allotrope covers the surface of the copper alloy powder" is used in a meaning including not only a case where the fact that the carbon allotrope completely covers the surface of the copper alloy powder can be observed by a scanning electron microscope, but also a case where the fact that the carbon allotrope only partially covers the surface of the copper alloy powder can be confirmed by a scanning electron microscope, but actually the carbon allotrope covers the surface of the copper alloy powder at the nanoscale. The fact that the carbon allotrope covers the surface of the copper alloy powder at the nanoscale can be confirmed by an Auger electron spectrometer.

The above transition metal belonging to group 8 to group 10 of the periodic table is not particularly limited. Preferred examples of the transition metal include iron, nickel, cobalt, or palladium. Among them, because of high catalytic activity, iron, nickel, or cobalt is desired, and iron or cobalt is more preferred. Cobalt is further preferred. However, a plurality of transition metals may be used in combination.

The above copper alloy powder is obtained, for example, by pulverization by an atomization method. The average particle diameter of this copper alloy powder is not particularly limited but is preferably 0.1 μm to 50 μm, more preferably 0.1 μm to 20 μm, and further preferably 0.1 μm to 5 μm.

When the average particle diameter of the copper alloy powder is in the above preferred range, a conductive paste having excellent electrical conductivity and thermal conductivity can be more reliably provided according to the present invention.

The above copper alloy powder may be spherical but desirably has a flake shape having an aspect ratio of greater than 1. Therefore, after atomization, the copper alloy powder is preferably subjected to flattening treatment by ball mill treatment, treatment in which a cold spray method or an aerosol deposition method is applied to powder processing, or the like. When the copper alloy powder is processed into a flake shape by a ball mill or the like, it is preferred that a flake powder having a long side of 5 to 50 µm is mixed. These flake powders are also obtained by subjecting atomized powders of about 1 to 5 µm to ball mill treatment.

In addition, the copper alloy powder is desirably cleaned with an etchant or the like before the carbon allotrope is adhered to the surface by CVD treatment described later.

In the above copper alloy powder, the total content of the above transition metal is preferably 0.1 to 10.0% by weight, more preferably 0.3 to 6.0% by weight, and further preferably 0.3 to 1.0% by weight in 100% by weight of the copper alloy powder. When the content of the transition metal is in the above range, a conductive filler and a conductive paste having excellent electrical conductivity and thermal conductivity can be much more reliably provided according to the present invention.

1-2. CVD Treatment of Copper Alloy Powder
(Production of Carbon Allotrope)

The conductive filler according to the present invention is composite particles in which a carbon allotrope is adhered to a copper alloy powder so as to cover the surface of the above copper alloy powder. Such composite particles can be formed by a CVD method in which a carbon source is contacted with a copper alloy powder surface at 400° C. to 750° C. In other words, a carbon allotrope is desirably produced on a copper alloy powder surface by the CVD method.

Examples of the above carbon allotrope include one or two or more graphene laminates and carbon nanofibers. As the above carbon nanofibers, carbon nanofibers having a small fiber diameter are more preferred. The carbon nanofibers refer to carbon fibers having a fiber diameter of about 5 to 500 nm.

It is desired to have a sea urchin-like shape in which one ends of a large number of carbon nanofibers are bonded to the above copper alloy powder surface. Composite particles having such a sea urchin-like shape are referred to as spiny particles. In the case of the spiny particle shape, high carbon nanofiber density is much more desired. In the case of the composite particles having the above spiny particle shape, surprisingly, it has been confirmed that when neighboring composite particles are contacted with each other, the electroconductivity is much higher than when copper alloy particles themselves are in contact with each other. In other words, when the composite particles having the above spiny particle shape are contacted with each other, the electroconductivity is much higher than the respective electroconductivity of the copper alloy and the carbon nanofibers constituting the composite particles. This is considered to be due to the following reason. When the composite particles contact each other, the carbon nanofibers constituting the spines of the spiny particles are entangled with each other between neighboring composite particles. Therefore, it is considered that the number of contact points increases, the contact resistance decreases, and the electroconductivity is dramatically increased.

In addition, it has been confirmed that the above carbon nanofibers have an sp2 structure and have electroconductivity, but whether the above carbon nanofibers exhibit very high electroconductivity like SWCNTs has not been confirmed. It is considered that in the conductive filler that is composite particles according to the present invention, when the electroconductivity is lower than the electroconductivity of CNT carbon nanoparticles in the length direction, it is preferred that shorter fibers are formed on the copper alloy powder surface. Also in this case, the carbon nanofibers are entangled with each other between neighboring composite particles, and the electroconductivity can be effectively increased.

Therefore, in the present invention, when the particle diameter of the copper alloy powder is about 0.1 µm to 50 µm, it is desired that the length of the carbon nanofibers is preferably about 0.01 µm to 5.0 µm, more preferably about 0.01 µm to 0.2 µm. Thus, by the entanglement of the carbon nanofibers with each other between neighboring composite particles, the contact resistance can be effectively decreased.

In addition, according to the results of observation by a high resolution transmission electron microscope and an Auger electron spectrometer, it has been confirmed that compounds such as the carbon allotrope and cobalt oxide adhere to the surface of the copper alloy powder. Therefore, it is also considered that the electroconductivity is increased by the influence of these.

Therefore, in the present invention, the amount of the carbon allotrope adhering to the copper alloy powder is also desirably in a certain range because the above carbon allotrope is used in order to reduce the contact resistance between copper particles though inferior in conductivity to copper.

The amount of the carbon allotrope adhering to the copper alloy powder in the present invention is not particularly limited but is preferably greater than 0% by weight and 4.0% by weight or less, more preferably greater than 0% by weight and 3.0% by weight or less, further preferably greater than 0% by weight and 1.5% by weight or less, and most preferably greater than 0% by weight and 1.0% by weight or less based on 100% by weight of the copper alloy powder because when the amount of the carbon allotrope adhering to the copper alloy powder is too large, the carbon allotrope inferior in conductivity to the copper alloy particles may decrease the conductivity.

As the carbon source used to produce the above carbon fibers on the copper alloy powder surface, various carbon materials can be used. For example, carbon-containing compounds having 1 to 30, preferably 1 to 7, more preferably 1 to 4, and further preferably 1 or 2 carbon atoms can be used. Examples of such compounds can include carbon monoxide, a hydrocarbon, or an alcohol. As the above hydrocarbon, a saturated hydrocarbon such as methane, ethane, or propane or an unsaturated hydrocarbon such as ethylene or acetylene can be appropriately used. Also for the above alcohol, methanol, ethanol, or the like can be appropriately used. Among them, a hydrocarbon such as ethylene is preferably used because carbon fibers are easily produced from a catalyst at low temperature.

Further, the above carbon source is desirably a material that is a gas at a high temperature of about 300° C. or more. Thus, it is easy to produce carbon fibers in a gas phase reaction.

The size of the above composite particles may be appropriately adjusted depending on the application method and use of the target conductive paste. For example, in an electroconductive paste used for an electroconductive adhesive or the like, the particle diameter of the composite particles is desirably about 1 µm to 50 µm.

On the other hand, when a paste is printed by stencil or the like, the average particle diameter of the composite particles is desirably 20 µm or less. Further, in a conductive paste used for screen printing, the average particle diameter of the composite particles is desirably about 0.5 µm to 10 µm. When flaky particles are mixed, the flaky particles are desirably about 1 µm to 50 µm.

In this manner, the average particle diameter of the above composite particles in the present invention may be appropriately selected according to the purpose of use, the application method, and the like.

In the production of the above conductive filler that is composite particles, after the step of providing a copper alloy powder comprising at least one transition metal belonging to group 8 to group 10 of the periodic table, a carbon source may be contacted with the copper alloy powder surface by the CVD method. Preferably, the above copper alloy powder is obtained by the atomization method as described above. Therefore, a copper alloy powder with small variations in average particle diameter can be obtained.

It is desired that the copper alloy powder is, for example, heat-treated in an oxidation-preventing atmosphere at 400 to 800° C. for several minutes to several thousand minutes, in order to be brought into a state in which catalyst nanoparticles are precipitated and dispersed in the copper alloy particles and on their surfaces (catalyst precipitation step). In order to prevent the aggregation of the powder in the CVD treatment, an apparatus in which the powder flows and is uniformly treated like a rotary kiln (rotary furnace) is desired.

In addition, in order to prevent the aggregation of the powder in the CVD treatment, smaller fine particles are desirably added to the copper alloy powder as a sintering inhibitor prior to step 1-A described later. Examples of such particles include AEROSIL, carbon black, and ketjen black. The amount of the particles added is desirably 0.05 to 2.0% by weight based on the copper alloy powder. The amount of the particles added is more preferably 0.1% by weight to 1.0% by weight.

A heat profile as one example of a method for producing a conductive filler that is composite particles according to the present invention is shown in FIG. 1. In the figure, treatment is performed under an ethylene gas atmosphere in the shaded portions and under a nitrogen gas atmosphere for other portions. Step 1-A shown in FIG. 1 comprises the step of contacting a copper powder with ethylene gas at 300 to 400° C. (aggregation prevention step). In step 1-B, the copper powder is held in an inert gas maintaining at 400 to 650° C. to precipitate a nanocatalyst in the copper powder and on the copper powder surface (catalyst precipitation step). In step 1-C, a carbon allotrope is produced from the nanocatalyst (carbon production step).

By contacting the copper powder with ethylene gas at low temperature (300 to 400° C.) in step 1-A, the aggregation of the powder (sintering due to placing the copper powder at high temperature for a long time) in step 1-B can be prevented. In addition, also by adding AEROSIL, a nanoscaled powder, mixing it, and kneading it as required and using it as a spacer as the pretreatment of step 1-A, the aggregation of the copper alloy powder at high temperature can be prevented. The dispersibility of the above AEROSIL is good, and the addition of the AEROSIL does not affect the electroconductivity of the conductive paste.

As the method for improving aggregation, it is possible to disperse (a jet mill, a ball mill, or the like) the powder after the catalyst precipitation step (step 1-B) and separately perform the carbon production step (step 1-C) in the following step. In addition, it is possible to process the powder into a flake shape by a ball mill or the like after steps 1-A to 1-C and separately perform a carbon production step (step 2-A shown in FIG. 2) in the following step. In this manner, it is also possible to perform treatment in the order of CVD treatment, flaking treatment, and re-CVD treatment to obtain composite flake particles.

The preceding step of washing the copper alloy powder with a nital solution (3% by weight nitric acid/ethanol solution) or the like, then further washing it using ethanol, and drying it is desirably provided before the CVD treatment (step 1-C).

In the present invention, as shown in FIG. 11, a heat treatment step (step 3-A) can be provided in an inert gas atmosphere after steps 1-A to 1-C. When the above step 3-A is provided, because of improvement in the electroconductivity of the carbon allotrope due to good crystallinity of the carbon allotrope, high concentration of the catalyst on the copper alloy particle surfaces due to further growth of the nanocatalyst to which the carbon allotrope adheres, and the like, the electroconductivity when the obtained composite particles are kneaded with a binder resin to form a paste can be much more increased, which is preferred.

The above inert gas is not particularly limited, but nitrogen gas or argon gas is preferably used.

The above heat treatment step (step 3-A) is preferably performed at a higher temperature than in steps 1-A to 1-C. The range of 750° C. to 1000° C. is more preferred. The above step 3-A may be performed separately from steps 1-A to 1-C.

2. Pasting Process 2-1. Binder Resin

The conductive paste according to the present invention is obtained by mixing a conductive filler that is composite particles obtained as described above and a binder resin and then kneading the obtained mixture. The binder resin is not particularly limited, and appropriate binder resins conventionally used in electroconductive pastes and thermally conductive pastes can be used. As such resins, at least one selected from the group consisting of epoxy resins, polyester resins, urethane resins, phenolic resins, and imide resins can be preferably used. When these resins and solvents are used, thermosetting and thermally drying pastes can be provided. However, the above binder resin may be appropriately selected according to the purpose of utilization such as an electroconductive paste or a thermally conductive paste.

As the binder resin used in the electroconductive paste, polyester resins, acrylic resins, butyral resins, and the like can be used. Thermoplastic resins such as thermoplastic polyimides can also be used. However, in order to ensure heat resistance, thermosetting resins are desirably used.

In other words, various epoxy resins, polyester resins, urethane resins, phenolic resins, thermosetting polyimides, and the like can be used as thermosetting resins, and a curing agent may be contained.

When a thermoplastic resin is used, a curing agent for curing the thermoplastic resin may be contained in the conductive paste. Examples of such a curing agent can include amine-based epoxy curing agents, acid anhydridebased epoxy curing agents, isocyanate-based curing agents, and imidazole-based curing agents. These resins may comprise a solvent.

The blending ratio of the above binder resin is not particularly limited, but 10 to 35 parts by mass of the binder resin are preferably contained based on 100 parts by mass of the above composite particles.

When a thermosetting resin or a thermoplastic resin is used, for the amount of each of these resins added, 10 to 35 parts by mass of each of these resins are desirably contained based on 100 parts by mass of the composite particles in terms of a weight ratio after the paste is dried or cured. 10 to 20 parts by mass of the above thermosetting resin or thermoplastic resin are more preferably contained based on 100 parts by mass of the composite particles.

Only one of the above binder resin may be used, or two or more of the above binder resins may be used in combination.

In the present invention, an inorganic filler other than carbon materials, such as silica or calcium carbonate, may be added to the above conductive paste in order to adjust thixotropy. Further, various coupling agents may be added in order to increase adhesiveness. The method for producing the above conductive paste is not particularly limited, and in addition to the above composite particles and the binder resin, the above additives and other additives such as a solvent and a reducing agent may be mixed as required, by an appropriate method.

adhesives and for the formation of electroconductive patterns and the like. Alternatively, since the above composite particles comprise a copper alloy powder and a carbon allotrope, the conductive paste of the present invention has excellent thermal conductivity and therefore can also be preferably used as thermally conductive pastes.

The conductive paste according to the present invention comprises the above conductive filler that is composite particles in which a carbon allotrope covers the surface of a copper alloy powder comprising a particular transition metal, and a binder resin and therefore exhibits excellent electrical conductivity and thermal conductivity. Particularly, when the carbon allotrope is carbon nanofibers, the carbon nanofibers are entangled with each other between neighboring composite particles, and the contact resistance decreases significantly. Therefore, the electrical conductivity can be higher than the original copper alloy powder.

Next, the effect of the present invention will be clarified by giving specific Examples of the present invention.

(1) Production of Copper Alloy Powders

A copper alloy powder was produced by a high pressure water atomization method and classified into a copper alloy powder having an average particle diameter of 3 μm by an air classifier.

Specifically, copper alloy powders A to F shown in the following Table 1 were provided. The following Table 1 shows the alloy components and average particle diameters of the copper alloy powders A to F.

TABLE 1

|  | Alloy components (at %) | | | Alloy components (% by weight) | | | Particle diameter |
| --- | --- | --- | --- | --- | --- | --- | --- |
|  | Copper | Iron | Cobalt | Copper | Iron | Cobalt | μm |
| Copper alloy powder A | 98.0% | 1.0% | 1.0% | 98.19% | 0.88% | 0.93% | 3 |
| Copper alloy powder B | 96.0% | 2.4% | 1.6% | 96.39% | 2.12% | 1.49% | 3 |
| Copper alloy powder C | 96.0% | 4.0% | 0.0% | 96.47% | 3.53% | 0.0% | 3 |
| Copper alloy powder D | 99.4% | 0.3% | 0.3% | 99.46% | 0.26% | 0.28% | 3 |
| Copper alloy powder E | 98.9% | 0.0% | 1.1% | 99.00% | 0.0% | 1.00% | 3 |
| Copper alloy powder F | 96.0% | 0.0% | 4.0% | 96.27% | 0.00% | 3.73% | 3 |

2-2. Mixing and Kneading Method

Also for this mixing method, the conductive filler, a resin, and other additives can be mixed, and then kneaded using a dissolver or a triple roll mill. When a triple roll mill is used, kneading is desirably performed by setting the gap between the rolls larger than the primary particle diameter of the filler. Thus, a more uniform conductive paste can be obtained.

In kneading, the fibrous carbon allotrope may break and shorten. In addition, a small amount of the carbon allotrope may adhere to the nano precipitated particles belonging to group 8 to group 10 of the periodic table in a shorter state. This is because for the contact between the composite particles, conductive contact is made in the portion of the carbon allotrope in the shortened state, and therefore the adverse effect of the oxidation of copper such as when the copper is in direct contact can be prevented.

The conductive paste of the present invention can be preferably used as various electrically conductive pastes, that is, electroconductive pastes, used for electroconductive (2) CVD Treatment of Copper Alloy Powders Composite particles were made by the following procedure using any of the copper alloy powders A to F obtained as described above. In other words, 6 g of the copper alloy powder was introduced into a cylindrical quartz cell having an inner diameter of 26 mm and a length of 120 mm, and in a rotary kiln using a rotary cylindrical quartz tube having an inner diameter of 32 mm and a length of 700 mm, ethylene as a carbon source was contacted with the copper alloy powder to produce carbon nanofibers as a carbon allotrope on the copper alloy powder surface. In this manner, spiny particles that are composite particles having a sea urchin-like shape in which carbon fibers are produced from the copper alloy powder are made. The production conditions of the composite particles are shown in the following Table 2 and Table 3. In Table 3 and Table 5 described later, composite particles 11 are redundantly described in order to make comparison with other composite particles easy, but the composition and making conditions of the composite particles 11 are not changed.

TABLE 2

| Composite particles | Copper alloy powder | Step 1-A Temperature increase Temperature (° C.) | increase time (min) | Gas (50 cc) | Step 1-B Temperature increase followed by holding at constant temperature Temperature (° C.) | Holding time (min) | Gas (50 cc) | Step 1-C Holding at constant temperature Temperature (° C.) | Holding time (min) |
|---|---|---|---|---|---|---|---|---|---|
| Composite particles 2 | Copper alloy powder A | RT→350 | 10 | Ethylene | 350→450 | 30 | Nitrogen | 550 | 3 |
| Composite particles 3 | Copper alloy powder A | RT→350 | 10 | Ethylene | 350→450 | 30 | Nitrogen | 550 | 2 |
| Composite particles 4 | Copper alloy powder B | RT→350 | 10 | Ethylene | 350→450 | 30 | Nitrogen | 550 | 3 |
| Composite particles 5 | Copper alloy powder C | RT→350 | 10 | Ethylene | 350→450 | 30 | Nitrogen | 550 | 3 |
| Composite particles 6 | Copper alloy powder D | RT→350 | 10 | Ethylene | 350→450 | 30 | Nitrogen | 550 | 3 |
| Composite particles 7 | Copper alloy powder E | RT→350 | 10 | Ethylene | 350→450 | 30 | Nitrogen | 550 | 3 |

| Composite particles | Step 1-C Holding at constant temperature Amount of gas (50 cc) | Cooling Temperature decrease Gas (50 cc) | Flaking Ball mill | Step 2-A Temperature (° C.) | Time (min) | Gas (50 cc) | FIG. |
|---|---|---|---|---|---|---|---|
| Composite particles 2 | Ethylene | Nitrogen | — | — | — | — | FIG. 4 |
| Composite particles 3 | Ethylene | Nitrogen | Flaking | 550 | 2 | Ethylene | FIGS. 5 and 6 |
| Composite particles 4 | Ethylene | Nitrogen | — | — | — | — | FIG. 7 |
| Composite particles 5 | Ethylene | Nitrogen | — | — | — | — | FIG. 8 |
| Composite particles 6 | Ethylene | Nitrogen | — | — | — | — | FIG. 9 |
| Composite particles 7 | Ethylene | Nitrogen | — | — | — | — | FIG. 10 |

TABLE 3

| Composite particles | Copper alloy powder | Amount of AEROSIL | Step 1-A Temperature increase Temperature Temp. (° C.) | increase time (min) | Gas (50 cc) | Step 1-B Temperature increase followed by holding at constant temperature Temp. (° C.) | Holding time (min) | Gas (50 cc) | Step 1-C Holding at constant temperature Temp. (° C.) |
|---|---|---|---|---|---|---|---|---|---|
| Composite particles 11 | Copper alloy powder E | 0.25% by weight | RT→350 | 10 | Ethylene | 350→475 | 30 | Nitrogen | 475 |
| Composite particles 12 | Copper alloy powder E | 0.25% by weight | RT→350 | 10 | Ethylene | 350→475 | 30 | Nitrogen | 475 |
| Composite particles 13 | Copper alloy powder E | 0.25% by weight | RT→350 | 10 | Ethylene | 350→475 | 30 | Nitrogen | 475 |
| Composite particles 14 | Copper alloy powder E | 0.25% by weight | RT→350 | 10 | Ethylene | 350→475 | 30 | Nitrogen | 475 |
| Composite particles 15 | Copper alloy powder E | 0.25% by weight | RT→350 | 10 | Ethylene | 350→475 | 30 | Nitrogen | 475 |
| Composite particles 11 | Copper alloy powder E | 0.25% by weight | RT→350 | 10 | Ethylene | 350→475 | 30 | Nitrogen | 475 |
| Composite particles 22 | Copper alloy powder F | 0.25% by weight | RT→350 | 10 | Ethylene | 350→475 | 30 | Nitrogen | 475 |
| Composite particles 23 | Copper alloy powder C | 0.25% by weight | RT→350 | 10 | Ethylene | 350→450 | 30 | Nitrogen | 550 |
| Composite particles 24 | Copper alloy powder A | 0.25% by weight | RT→350 | 10 | Ethylene | 350→450 | 30 | Nitrogen | 550 |
| Composite particles 11 | Copper alloy powder E | 0.25% by weight | RT→350 | 10 | Ethylene | 350→475 | 30 | Nitrogen | 475 |
| Composite particles 32 | Copper alloy powder E | 0.25% by weight | RT→350 | 10 | Ethylene | 350→475 | 30 | Nitrogen | 475 |
| Composite particles 33 | Copper alloy powder E | 0.25% by weight | RT→350 | 10 | Ethylene | 350→475 | 30 | Nitrogen | 475 |

TABLE 3-continued

| | | | | | | | | | |
|---|---|---|---|---|---|---|---|---|---|
| Composite particles 34 | Copper alloy powder E | 0.25% by weight | RT→350 | 10 | Ethylene | 350→475 | 30 | Nitrogen | 475 |
| Composite particles 35 | Copper alloy powder E | 0.25% by weight | RT→350 | 10 | Ethylene | 350→475 | 30 | Nitrogen | 475 |
| Composite particles 11 | Copper alloy powder E | 0.25% by weight | RT→350 | 10 | Ethylene | 350→475 | 30 | Nitrogen | 475 |
| Composite particles 42 | Copper alloy powder E | 1% by weight | RT→350 | 10 | Ethylene | 350→475 | 30 | Nitrogen | 475 |
| Composite particles 43 | Copper alloy powder E | 0.1% by weight | RT→350 | 10 | Ethylene | 350→475 | 30 | Nitrogen | 475 |

| | Step 1-C Holding at constant temperature | | Step 3-A | | | Cooling Temp. decrease | | |
|---|---|---|---|---|---|---|---|---|
| Composite particles | Holding time (min) | Gas (50 cc) | Temp. (° C.) | Time (min) | Gas (50 cc) | Gas (50 cc) | FIG. | Amount of adhering carbon |
| Composite particles 11 | 2 | Ethylene | 925 | 30 | Nitrogen | Nitrogen | FIG. 12 | 0.7% by weight |
| Composite particles 12 | 1 | Ethylene | 925 | 30 | Nitrogen | Nitrogen | — | 0.3% by weight |
| Composite particles 13 | 4 | Ethylene | 925 | 30 | Nitrogen | Nitrogen | — | 1.5% by weight |
| Composite particles 14 | 8 | Ethylene | 925 | 30 | Nitrogen | Nitrogen | — | 3.3% by weight |
| Composite particles 15 | 0.25 | Ethylene | 775 | 30 | Nitrogen | Nitrogen | — | 0.1% by weight or less |
| Composite particles 11 | 2 | Ethylene | 925 | 30 | Nitrogen | Nitrogen | FIG. 12 | 0.7% by weight |
| Composite particles 22 | 2 | Ethylene | 925 | 30 | Nitrogen | Nitrogen | — | — |
| Composite particles 23 | 3 | Ethylene | 925 | 30 | Nitrogen | Nitrogen | | — |
| Composite particles 24 | 3 | Ethylene | 875 | 30 | Nitrogen | Nitrogen | | — |
| Composite particles 11 | 2 | Ethylene | 925 | 30 | Nitrogen | Nitrogen | FIG. 12 | 0.7% by weight |
| Composite particles 32 | 2 | Ethylene | 725 | 30 | Nitrogen | Nitrogen | — | — |
| Composite particles 33 | 2 | Ethylene | 825 | 30 | Nitrogen | Nitrogen | — | — |
| Composite particles 34 | 2 | Ethylene | 1000 | 30 | Nitrogen | Nitrogen | — | — |
| Composite particles 35 | 2 | Ethylene | 1100 | 30 | Nitrogen | Nitrogen | — | — |
| Composite particles 11 | 2 | Ethylene | 925 | 30 | Nitrogen | Nitrogen | FIG. 12 | 0.7% by weight |
| Composite particles 42 | 2 | Ethylene | 925 | 30 | Nitrogen | Nitrogen | — | — |
| Composite particles 43 | 2 | Ethylene | 925 | 30 | Nitrogen | Nitrogen | | |

In Table 3, for AEROSIL, AEROSIL 300 manufactured by NIPPON AEROSIL CO., LTD. was used. AEROSIL was added and mixed with the copper alloy powders A, C, E, and F as the pretreatment of step 1-A when the composite particles 11 to 15, 22 to 24, 32 to 35.42, and 43 were produced.

For the composite particles 3, the copper carbon fiber spiny particles obtained in steps 1-A, 1-B, and 1-C were further subjected to ball mill treatment and then subjected to re-CVD treatment as shown in FIG. 2. As shown in FIG. 2, in the re-CVD treatment, the catalyst precipitation step can be skipped, and therefore only step 2-A may be performed.

(3) Preparation of Pastes

Any of the composite particles obtained as described above, a binder resin shown in the following Table 4 and Table 5, and BCA (butyl cellosolve acetate) or DPMA (dipropylene glycol methyl ether acetate) as a solvent were mixed at a ratio shown in the following Table 4 and Table 5. This mixture was kneaded and dispersed to obtain each of the electroconductive pastes of Examples and a Comparative Example shown in Table 4 and Table 5.

TABLE 4

| | Ex. 1 | Ex. 2 | Ex. 3 | Ex. 4 | Ex. 5 | Ex. 6 | Comp. Ex. 1 |
|---|---|---|---|---|---|---|---|
| Composite particles 2 | 100 | | | | | | |
| Composite particles 3 | | 100 | | | | | |
| Composite particles 4 | | | 100 | | | | |
| Composite particles 5 | | | | 100 | | | |
| Composite particles 6 | | | | | | | 100 |

TABLE 4-continued

|  |  | Ex. 1 | Ex. 2 | Ex. 3 | Ex. 4 | Ex. 5 | Ex. 6 | Comp. Ex. 1 |
|---|---|---|---|---|---|---|---|---|
|  | Composite particles 7 |  |  |  |  |  | 100 |  |
|  | Copper alloy powder A |  |  |  |  |  |  | 100 |
| Binder resin | Epoxy resin | 7 | 10 | 7 | 7 | 20 | 20 | 7 |
|  | Imidazole curing agent | 1.2 | 1.8 | 1.2 | 1.2 | 1.2 | 1.2 | 1.2 |
| Solvent | BCA | 15 | 20 | 15 | 15 | 15 | 15 | 15 |
|  |  | Electro-conductivity measurement | Electro-conductivity measurement |  |  |  |  | Electro-conductivity measurement |

TABLE 5

|  |  | Ex. 11 | Ex. 12 | Ex. 13 | Ex. 14 | Ex. 15 | Ex. 11 | Ex. 22 | Ex. 23 | Ex. 24 |
|---|---|---|---|---|---|---|---|---|---|---|
|  |  | Standard (ethylene 2 min) | Ethylene 1 min | Ethylene 4 min | Ethylene 8 min | Ethylene 0.25 min | Standard (Co 1.0%) | Co3.73% | Fe3.53% | Fe0.88% Co93% |
|  | Composite particles 11 | 100 |  |  |  |  |  |  |  |  |
|  | Composite particles 12 |  | 100 |  |  |  |  |  |  |  |
|  | Composite particles 13 |  |  | 100 |  |  |  |  |  |  |
|  | Composite particles 14 |  |  |  | 100 |  |  |  |  |  |
|  | Composite particles 15 |  |  |  |  | 100 |  |  |  |  |
|  | Composite particles 11 |  |  |  |  |  | 100 |  |  |  |
|  | Composite particles 22 |  |  |  |  |  |  | 100 |  |  |
|  | Composite particles 23 |  |  |  |  |  |  |  | 100 |  |
|  | Composite particles 24 |  |  |  |  |  |  |  |  | 100 |
|  | Composite particles 11 |  |  |  |  |  |  |  |  |  |
|  | Composite particles 32 |  |  |  |  |  |  |  |  |  |
|  | Composite particles 33 |  |  |  |  |  |  |  |  |  |
|  | Composite particles 34 |  |  |  |  |  |  |  |  |  |
|  | Composite particles 35 |  |  |  |  |  |  |  |  |  |
|  | Composite particles 11 |  |  |  |  |  |  |  |  |  |
|  | Copper alloy powder 42 |  |  |  |  |  |  |  |  |  |
|  | Copper alloy powder 43 |  |  |  |  |  |  |  |  |  |
| Binder resin | Epoxy resin |  |  |  |  |  |  |  |  |  |
|  | Imidazole curing agent |  |  |  |  |  |  |  |  |  |
|  | Phenolic resin | 16 | 16 | 16 | 16 | 16 | 16 | 16 | 16 | 16 |
| Solvent | DPMA | 15 | 15 | 15 | 15 | 15 | 15 | 15 | 15 | 15 |
|  |  | Electro-conductivity measurement | Electro-conductivity measurement | Electro-conductivity measurement | Electro-conductivity measurement | Electro-conductivity measurement | Electro-conductivity measurement | Electro-conductivity measurement | Electro-conductivity measurement | Electro-conductivity measurement |

|  |  | Ex. 11 | Ex. 32 | Ex. 33 | Ex. 34 | Ex. 35 | Ex. 11 | Ex. 42 | Ex. 43 |
|---|---|---|---|---|---|---|---|---|---|
|  |  | Standard (925° C. reheating) | 725° C. reheating | 825° C. reheating | 1000° C. reheating | 1100° C. reheating | Standard (AEROSIL 0.25%) | AEROSIL 1.0% | AEROSIL 0.1% |
|  | Composite particles 11 |  |  |  |  |  |  |  |  |
|  | Composite particles 12 |  |  |  |  |  |  |  |  |
|  | Composite particles 13 |  |  |  |  |  |  |  |  |
|  | Composite particles 14 |  |  |  |  |  |  |  |  |
|  | Composite particles 15 |  |  |  |  |  |  |  |  |
|  | Composite particles 11 |  |  |  |  |  |  |  |  |
|  | Composite particles 22 |  |  |  |  |  |  |  |  |
|  | Composite particles 23 |  |  |  |  |  |  |  |  |
|  | Composite particles 24 |  |  |  |  |  |  |  |  |
|  | Composite particles 11 | 100 |  |  |  |  |  |  |  |
|  | Composite particles 32 |  | 100 |  |  |  |  |  |  |
|  | Composite particles 33 |  |  | 100 |  |  |  |  |  |
|  | Composite particles 34 |  |  |  | 100 |  |  |  |  |
|  | Composite particles 35 |  |  |  |  | 100 |  |  |  |
|  | Composite particles 11 |  |  |  |  |  | 100 |  |  |
|  | Copper alloy powder 42 |  |  |  |  |  |  | 100 |  |
|  | Copper alloy powder 43 |  |  |  |  |  |  |  | 100 |

TABLE 5-continued

| | | | | | | | | | |
|---|---|---|---|---|---|---|---|---|---|
| Binder resin | Epoxy resin Imidazole curing agent | | | | | | | | |
| | Phenolic resin | 16 | 16 | 16 | 16 | 16 | 16 | 16 | 16 |
| Solvent | DPMA | 15 | 15 | 15 | 15 | 15 | 15 | 15 | 15 |
| | | Electro-conductivity measurement | Electro-conductivity measurement | Electro-conductivity measurement | Electro-conductivity measurement | Electro-conductivity measurement | Electro-conductivity measurement | Electro-conductivity measurement | Electro-conductivity measurement |

As the epoxy resin in Table 4, a bisphenol A type epoxy resin (manufactured by Japan Epoxy Resin, trade name: EPIKOTE 828) was used. As the imidazole curing agent, the trade name: 2P4MHZ manufactured by SHIKOKU CHEMICALS CORPORATION was used. BCA is an abbreviation of butyl cellosolve acetate, and DPMA is an abbreviation of dipropylene glycol methyl ether acetate. As the phenolic resin in Table 5, a known resol type phenolic resin (manufactured by Gun Ei Chemical Industry Co., Ltd., trade name: RESITOP PL-5208, phenol content 65%) used as the resin binder of a usual electroconductive paste was used.

In Table 5 and FIG. 14 described later, Example 11 is redundantly described in order to make the comparison of Examples 22 to 24, Examples 32 to 35, and Examples 42 and 43 with Example 11 easy, but the contents of Example 11 themselves are not changed.

(4) Evaluation

For each electroconductive paste obtained as described above, electroconductivity was evaluated.

The specific resistance was measured by a low resistance digital multimeter using four point probe resistivity measurements after the electroconductive paste was applied to an epoxy substrate to a width of 2 mm, a length of 100 mm, and a thickness of 200 μm and thermally cured for 30 minutes. The specific resistance is obtained by specific resistance=R×S/L (Ω·cm). R is the resistance value of the digital multimeter, S is the cross-sectional area of the coating film comprising the electroconductive paste, and L is the distance between the electrodes. The thermal curing was performed at temperatures of 120° C. and 170° C. for the epoxy resin and the phenolic resin, respectively. The results are shown in FIG. 3. As is clear from FIG. 3, it is seen that under both conditions with and without compression, the electroconductive pastes of Examples 1 and 2 have lower specific resistance than the electroconductive paste of Comparative Example 1. In FIG. 3 and FIG. 14 described later, the specific resistance of a silver bulk, a copper bulk, a carbon paste, and a silver paste is shown together.

FIG. 14 is a diagram showing the results of specific resistance measurement under conditions without compression. When Examples 11 to 15 in which the holding time in step 1-C was changed were compared, good specific resistance was obtained in Example 11: the amount of adhering carbon 0.7% (ethylene gas 2 minutes). It is seen that in Example 13: 1.5% (ethylene gas 4 minutes) and Example 14: 3.3% (ethylene gas 8 minutes) in which the amount of adhering carbon increases, the specific resistance increases compared with Example 11. The amount of adhering carbon in Example 15 (ethylene gas 0.25 minute) in which the amount of adhering carbon decreased was measured by weight increase before and after CVD but was an amount equal to or less than measurement variations. However, also for Example 15, it was confirmed that the color of the particles changed from copper to blackish brown due to carbon adhesion, and furthermore the adhesion of carbon was confirmed by measurement by an Auger electron spectrometer.

When Example 11 and Examples 22 to 24 were compared, good specific resistance was obtained in Example 11: the amount of cobalt in the alloy 1.0% by weight. When compared with Example 11, the specific resistance increased slightly in Example 24: an alloy of 0.88% by weight of cobalt and 0.93% by weight of iron, and the specific resistance increased greatly in Example 23: an alloy of 3.73% by weight of iron.

When Example 11 and Examples 32 to 35 are compared, it is seen that good specific resistance is obtained with a reheating temperature of 825° C. or more in step 3-A.

When Example 11 and Examples 42 and 43 are compared, it is seen that the specific resistance is not greatly affected up to an amount of AEROSIL added of 1.0% by weight.

Further, electron micrographs of the composite particles of Examples 1 to 6 and Example 11 obtained as described above are shown in FIG. 4 to FIG. 10, FIG. 12, and FIG. 13. As is clear from FIG. 4 to FIG. 10, FIG. 12, and FIG. 13, it is seen that the carbon fibers protruding grow from the surface of the copper alloy powder, and the composite particles have a sea urchin-like shape as a whole.

The invention claimed is:

1. A conductive filler comprising a copper alloy powder comprising at least one transition metal belonging to group 8 to group 10 of the periodic table, and a carbon allotrope covering a surface of the copper alloy powder,
    wherein a content of the transition metal in the copper alloy powder is 0.3 to 6.0% by weight based on 100% by weight of the copper alloy powder,
    wherein the carbon allotrope adheres to the surface of the copper alloy powder in a range of greater than 0% by weight and 3% by weight or less based on 100% by weight of the copper alloy powder,
    wherein the carbon allotrope is carbon nanofibers, and
    wherein first ends of the carbon nanofibers are bonded to the copper alloy powder surface.

2. The conductive filler according to claim 1, wherein the copper alloy powder is flaky.

3. The conductive filler according to claim 1, wherein the transition metal is iron or cobalt.

4. The conductive filler according to claim 3, wherein the transition metal is cobalt.

5. A conductive paste comprising the conductive filler according to claim 1 and a binder resin.

6. The conductive paste according to claim 5, wherein the binder resin is at least one resin selected from a group consisting of an epoxy resin, a polyester resin, a urethane resin, a phenolic resin, and an imide resin.

7. The conductive paste according to claim 6, further comprising at least one curing agent selected from the group consisting of amine-based epoxy curing agents, acid anhydride-based epoxy curing agents, isocyanate-based curing agents, and imidazole-based curing agents.

8. The conductive paste according to claim 5, comprising 10 to 35 parts by mass of the binder resin based on 100 parts by mass of the conductive filler.

9. The conductive paste according to claim 5, wherein the conductive paste has electrical conductivity.

10. The conductive paste according to claim 5, wherein the conductive paste has thermal conductivity.

11. The conductive paste according to claim 5, further comprising at least one inorganic filler selected from the group consisting of silica and calcium carbonate.

12. A method for producing the conductive filler according to claim 1, comprising steps of:
providing a copper alloy powder comprising at least one transition metal belonging to group 8 to group 10 of the periodic table; and
contacting a carbon source with a surface of the copper alloy powder to obtain a conductive filler.

13. The method for producing the conductive filler according to claim 12, wherein the step of providing a copper alloy powder is performed by an atomization method.

14. The method for producing the conductive filler according to claim 12, wherein the step of contacting a carbon source with a surface of the copper alloy powder to obtain a conductive filler is a step of performing treatment in order of CVD treatment, flaking treatment, and re-CVD treatment to obtain a conductive filler.

15. The method for producing the conductive filler according to claim 12, wherein the step of contacting a carbon source with a surface of the copper alloy powder to obtain a conductive filler is a step of performing treatment in order of CVD treatment and heat treatment to obtain a conductive filler.

16. The method for producing the conductive filler according to claim 15, wherein the heat treatment is performed under an inert gas atmosphere under a temperature atmosphere of 750° C. to 1000° C.

17. The method for producing the conductive filler according to claim 12, wherein the step of contacting a carbon source with a surface of the copper alloy powder to obtain a conductive filler comprises a step of contacting the copper alloy powder with a carbon-containing gas at 300° C. to 400° C.

18. The method for producing the conductive filler according to claim 12, further comprising a step of adding and mixing a sintering inhibitor before the step of contacting a carbon source with a surface of the copper alloy powder to obtain a conductive filler.

19. A method for producing a conductive paste, comprising steps of:
producing a conductive filler by the method for producing the conductive filler according to claim 12; and
mixing the conductive filler and a binder resin and then kneading an obtained mixture to obtain a conductive paste.

* * * * *